(12) United States Patent
Bae et al.

(10) Patent No.: US 10,388,910 B2
(45) Date of Patent: Aug. 20, 2019

(54) DISPLAY DEVICE INCLUDING A BARRIER LAYER AND METHOD FOR MANUFACTURING THE SAME

(71) Applicant: SAMSUNG DISPLAY CO., LTD., Yongin-si, Gyeonggi-Do (KR)

(72) Inventors: Injun Bae, Seoul (KR); Junhee Lee, Hwaseong-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/977,447

(22) Filed: May 11, 2018

(65) Prior Publication Data
US 2019/0097170 A1    Mar. 28, 2019

(30) Foreign Application Priority Data

Sep. 26, 2017  (KR) ........................ 10-2017-0124097

(51) Int. Cl.
| | | |
|---|---|---|
| *H01L 27/32* | (2006.01) | |
| *H01L 51/52* | (2006.01) | |
| *H01L 51/56* | (2006.01) | |
| *G09G 3/3266* | (2016.01) | |
| *G09G 3/3291* | (2016.01) | |

(52) U.S. Cl.
CPC ....... *H01L 51/5253* (2013.01); *G09G 3/3266* (2013.01); *G09G 3/3291* (2013.01); *H01L 27/3246* (2013.01); *H01L 27/3262* (2013.01); *H01L 27/3276* (2013.01); *H01L 51/5203* (2013.01); *H01L 51/56* (2013.01)

(58) Field of Classification Search
None
See application file for complete search history.

(56) References Cited

U.S. PATENT DOCUMENTS

| | | | | |
|---|---|---|---|---|
| 6,501,217 B2* | 12/2002 | Beierlein | ............ | H01L 51/5088 313/503 |
| 6,570,325 B2* | 5/2003 | Graff | ............ | H01L 51/5256 313/502 |
| 9,012,890 B2 | 4/2015 | You et al. | | |
| 2002/0125822 A1* | 9/2002 | Graff | ............ | H01L 51/5256 313/506 |
| 2014/0326963 A1* | 11/2014 | Yang | ............ | H01L 51/56 257/40 |
| 2015/0102324 A1* | 4/2015 | Lee | ............ | H01L 27/3244 257/40 |
| 2016/0036003 A1* | 2/2016 | Watabe | ............ | H01L 51/5246 257/40 |
| 2017/0081527 A1 | 3/2017 | De Zeeuw et al. | | |

FOREIGN PATENT DOCUMENTS

| | | |
|---|---|---|
| JP | 2001351778 | 12/2001 |
| KR | 1020120004785 | 1/2012 |
| KR | 10-1476746 | 12/2014 |

* cited by examiner

*Primary Examiner* — J. E. Schoenholtz
(74) *Attorney, Agent, or Firm* — F. Chau & Associates, LLC

(57) ABSTRACT

A display device includes a first substrate and a barrier layer disposed on the first substrate. A thin film transistor is on the barrier layer. An organic light emitting element is connected to the thin film transistor. The barrier layer includes a metal including at least one of Al, Ag, Cu, Mo, Cr, or Ta.

20 Claims, 5 Drawing Sheets

DISPLAY DEVICE INCLUDING A BARRIER LAYER AND METHOD FOR MANUFACTURING THE SAME

CROSS-REFERENCE TO RELATED APPLICATION

This application claims priority under 35 U.S.C. § 119 to Korean Patent Application No. 10-2017-0124097, filed on Sep. 26, 2017, in the Korean Intellectual Property Office (KIPO), the disclosure of which is incorporated by reference herein in its entirety.

TECHNICAL FIELD

Exemplary embodiments of the present invention relate to a display device and to a method of manufacturing the display device, and more particularly, to a display device including a barrier layer and to a method of manufacturing the display device.

DISCUSSION OF RELATED ART

Organic light emitting diode ("OLED") display devices may be self-light emitting display devices that display images using an OLED which emits light. The OLED display devices are currently garnering attention by virtue of their characteristics such as relatively low power consumption, relatively high luminance, and relatively high reaction speed.

The OLED display device may include a substrate, a thin film transistor on the substrate, and an OLED connected to the thin film transistor. The operating characteristics of the thin film transistor may fluctuate due to electric charges existing in the substrate, which may result in display failure of the display device.

SUMMARY

Exemplary embodiments of the present invention may be directed to a display device capable of substantially preventing display failure due to electric charges in a substrate and to a method of manufacturing the display device.

According to an exemplary embodiment of the present invention, a display device includes a first substrate and a barrier layer disposed on the first substrate. A thin film transistor is on the barrier layer. An organic light emitting element is connected to the thin film transistor. The barrier layer includes a metal including at least one of Al, Ag, Cu, Mo, Cr, or Ta.

The barrier layer may include an oxide of the metal. The oxide of the metal may have an increasingly higher density in a direction toward the organic light emitting element.

The display device may include a second substrate on a lower surface of the first substrate.

The display device may include an auxiliary buffer layer between the barrier layer and the first substrate.

The display device may include a wiring electrically connected to a power supply portion and electrically connected to the thin film transistor and the organic light emitting element. The power supply portion may be configured to provide a substantially constant voltage to the thin film transistor and the organic light emitting element. The wiring may be electrically connected to the barrier layer.

The wiring may include at least one of a common power line, a high potential line, or an initialization line.

The barrier layer may have a thickness of about 800 Å or more.

The organic light emitting element may include a first electrode on the barrier layer. A light emitting layer may be on the first electrode. A second electrode may be on the light emitting layer.

The display device may include a thin film encapsulation layer on the organic light emitting element.

The thin film encapsulation layer may include at least one inorganic layer on the organic light emitting element and at least one organic layer on the first inorganic layer.

According to an exemplary embodiment, a method of manufacturing a display device includes forming a barrier layer on a first substrate and forming a thin film transistor on the barrier layer. The method includes forming an organic light emitting element on the thin film transistor. The method includes forming a thin film encapsulation layer on the organic light emitting element. Forming of the barrier layer on the first substrate includes substantially simultaneously depositing a metal and an oxygen gas.

A metal oxide included in the barrier layer may have an increasingly higher density in a direction toward the organic light emitting element.

The method may include, before forming the barrier layer on the first substrate, disposing the first substrate on a second substrate.

The method may include, before forming the barrier layer on the first substrate, forming a first auxiliary buffer layer on the second substrate and disposing the first substrate on the first auxiliary buffer layer.

Forming of the metal layer may include depositing a metal through sputtering.

The metal may include at least one of Al, Ag, Cu, Mo, Cr, or Ta.

According to an exemplary embodiment of the present invention, a display device includes a substrate and an auxiliary buffer layer disposed on the substrate. A barrier layer is disposed on the auxiliary buffer layer. A buffer layer is disposed on the barrier layer. A thin film transistor is disposed on the barrier layer. A light emitting element is positioned above the thin film transistor. The light emitting element overlaps the thin film transistor along a direction orthogonal to an upper surface of the substrate. The barrier layer includes an oxide of Al, Ag, Cu, Mo, Cr, or Ta. A density of the oxide is increased in a direction toward the light emitting element.

BRIEF DESCRIPTION OF THE DRAWINGS

A more complete appreciation of the present invention will become more apparent by describing in detail exemplary embodiments thereof with reference to the accompanying drawings, in which.

DETAILED DESCRIPTION

Figure 1:
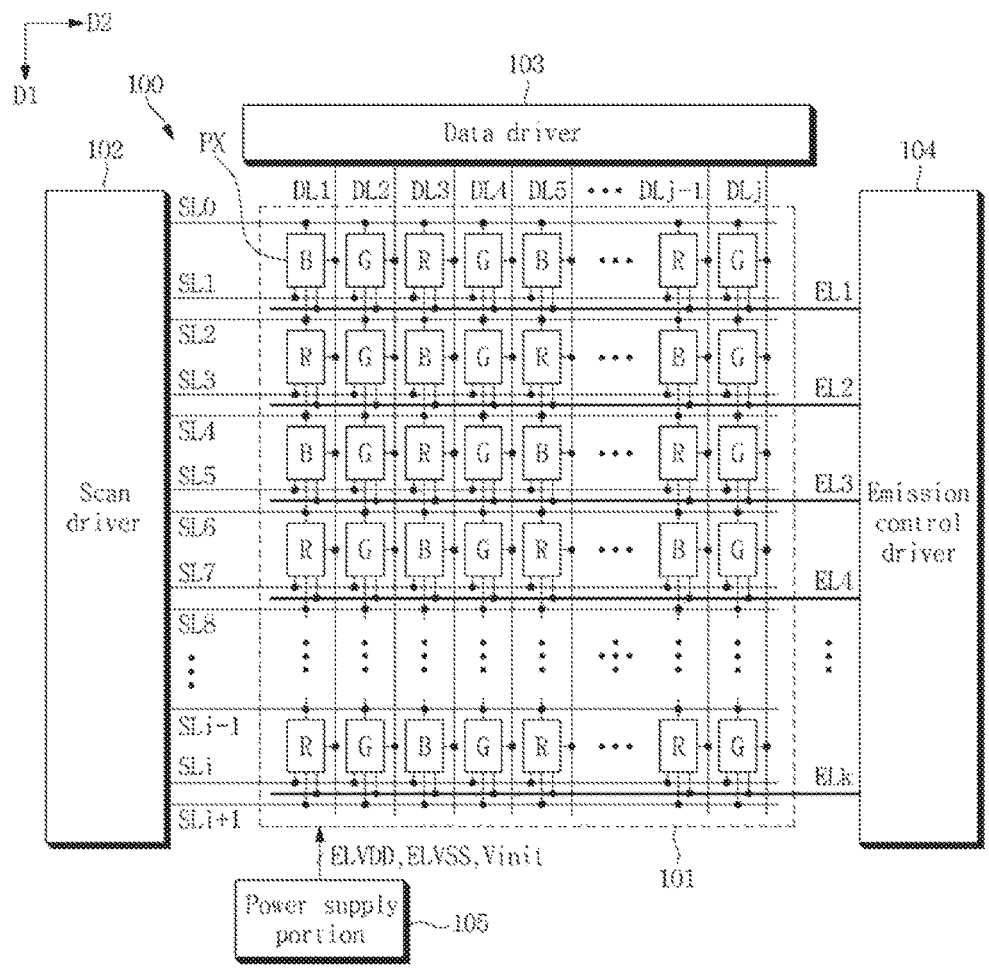
FIG. 1 is a block diagram illustrating a display device according to an exemplary embodiment of the present invention.

Exemplary embodiments of the present invention will be described below in more detail with reference to the accompanying drawings. In this regard, the exemplary embodiments may have different forms and should not be construed as being limited to the exemplary embodiments of the present invention described herein. Like reference numerals may refer to like elements throughout the specification and drawings.

In the drawings, thicknesses of layers (e.g., of a plurality of layers) and areas may be exaggerated for clarity of description. It will be understood that when a component, such as a layer, a film, a region, or a plate, is referred to as being "on" another component, the component may be directly on the other component or intervening components may be present.

Throughout the specification, when an element is referred to as being "connected" to another element, the element may be "directly connected" to the other element, or "electrically connected" to the other element with one or more intervening elements interposed therebetween.

It will be understood that although the terms "first" and "second" may be used herein to describe various components, these components should not be limited by these terms "About" or "approximately" as used herein is inclusive of the stated value and means within an acceptable range of deviation for the particular value as determined by one of ordinary skill in the art, considering the measurement in question and the error associated with measurement of the particular quantity (e.g., the limitations of the measurement system).

FIG. 1 is a block diagram illustrating a display device according to an exemplary embodiment of the present invention.

A display device 100 according to an exemplary embodiment of the present invention may include a display panel 101, a scan driver 102, a data driver 103, an emission control driver 104, and a power supply portion 105.

The display panel 101 may include scan lines SL0 to SLi+1, data lines DL1 to DLj, emission control lines EL1 to ELk, and pixels PX.

The scan lines SL0 to SLi+1 may be arranged along a first direction D1 and each of the scan lines SL0 to SLi+1 may extend along a second direction D2. The first direction D1 may cross the second direction D2. For example, the first direction D1 may be perpendicular to the second direction D2. The data lines DL1 to DLj may be arranged along the second direction D2 and each of the data lines DL1 to DLj may extend along the first direction D1. The emission control lines EL1 to ELk may be arranged along the first direction D1 and each of the emission control lines EL1 to ELk may extend along the second direction D2. However, exemplary embodiments of the present invention are not limited thereto, and the lines may be arranged along or extend in various directions. For example, the first and second directions may cross each other, but might not be perpendicular to each other.

The scan driver 102 may generate scan signals according to a scan control signal provided from a timing controller and may sequentially apply the scan signals to the plurality of scan lines SL0 to SLi+1.

The data driver 103 may apply data voltages to the data lines DL1 to DLj, respectively. For example, the data driver 103 may receive image data signals and a data control signal from a timing controller. The data driver 103 may sample the image data signals according to the data control signal, may latch the sampled image data signals corresponding to one horizontal line in each horizontal period, and may apply the latched image data signals to the data lines DL1 to DLj substantially simultaneously.

The emission control driver 104 may generate emission control signals according to a control signal provided from a timing controller and may sequentially apply the emission control signals to the plurality of emission control lines EL1 to ELk. In an exemplary embodiment of the present invention, the emission control driver 104 may be embedded in the scan driver 102. For example, the scan driver 102 may further perform the function of the emission control driver 104. In an exemplary embodiment of the present invention, the scan lines SL0 to SLi+1 and the emission control lines EL1 to ELk may be driven together by the scan driver 102.

The power supply portion 105 may supply a low potential driving voltage ELVSS, a high potential driving voltage ELVDD, and an initialization voltage Vinit through a power wiring connected to the pixel PX. For example, the power supply portion 105 may supply the low potential driving voltage ELVSS, the high potential driving voltage ELVDD, and the initialization voltage Vinit through a common power line, a high potential line VDL, and an initialization line IL. In an exemplary embodiment of the present invention, the low potential driving voltage ELVSS, the high potential driving voltage ELVDD, and the initialization voltage Vinit may each be constant voltages. As an example, the power supply portion may be a power supply, such as an AC/DC power supply.

The pixels PX may be arranged on the display panel 101. For example, the pixels PX may be arranged in the form of a matrix. These pixels PX may be disposed at a display area of the display panel 101. These pixels PX may emit light of different colors, such as red (R), green (G), or blue (B).

Each pixel PX may commonly receive the low potential driving voltage ELVSS, the high potential driving voltage ELVDD, and the initialization voltage Vinit from the power supply portion 105.

Figure 2:
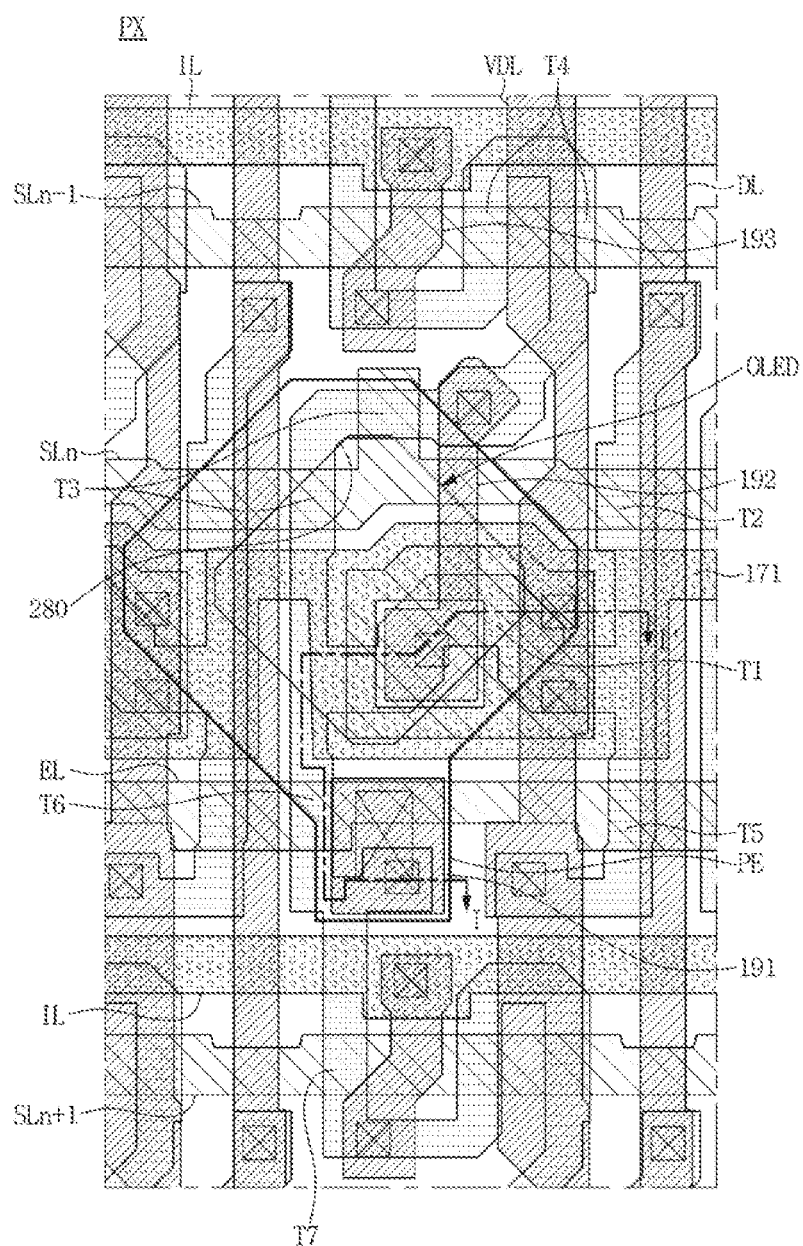
FIG. 2 is a plan view illustrating one of pixels illustrated in FIG. 1.
Figure 3:
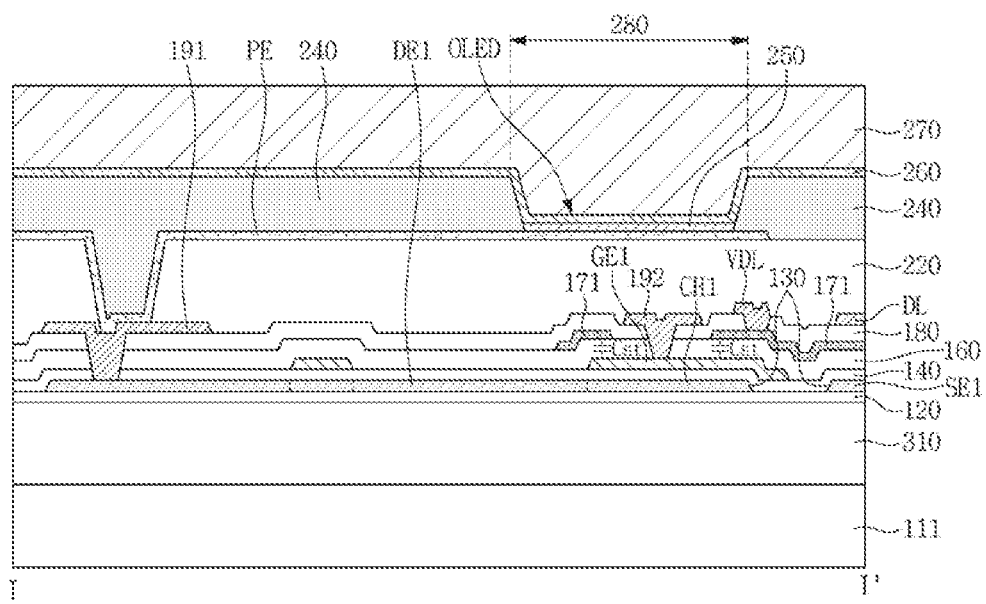
FIG. 3 is a cross-sectional view taken along the line I-I' of FIG. 2.

FIG. 2 is a plan view illustrating one of pixels illustrated in FIG. 1. FIG. 3 is a cross-sectional view taken along the line I-I' of FIG. 2.

Referring to FIG. 2, one pixel PX may include a plurality of thin film transistors T1, T2, T3, T4, T5, T6, and 17, a plurality of wirings SLn−1, SLn, SLn+1, EL, IL, DL, and VDL selectively connected to the plurality of thin film transistors T1, T2, T3, T4, T5, T6, and T7, and an organic light emitting element (e.g., an organic light emitting diode OLED).

The plurality of thin film transistors T1, T2, T3, T4, T5, T6, and T7 may include a first thin film transistor T1, a second thin film transistor T2, a third thin film transistor T3, a fourth thin film transistor T4, a fifth thin film transistor T5, a sixth thin film transistor T6, and a seventh thin film transistor T7.

Each of the first, second, third, fourth, fifth, sixth and seventh thin film transistors T1, T2, T3, T4, T5, 1T6 and T7 may be a P-type thin film transistor. However, exemplary embodiments of the present invention are not limited thereto, and in an exemplary embodiment of the present invention, each of the first, second, third, fourth, fifth, sixth and seventh thin film transistors T1, T2, T3, T4, T5, T6 and T7 may be an N-type thin film transistor.

In an exemplary embodiment of the present invention, the configuration of the pixel PX of the display device according to an exemplary embodiment is not limited to the above described configuration. For example, the pixel PX of the display device may include wirings which include a plurality of thin film transistors, one or more capacitors, one or more gate lines, and one or more driving power lines.

The display device according to an exemplary embodiment of the present invention may include a barrier layer 310, a first substrate 111, a buffer layer 120, a semiconductor layer 130, a gate insulating layer 140, a gate electrode GE1, scan lines SLn−1, SLn, and SLn+1, an emission control line EL, a first insulating interlayer 160, an initialization line IL, a capacitor electrode 171, a second insulating interlayer 180, a first connection electrode 191, a second connection electrode 192, a third connection electrode 193, a data line DL, a high potential line VDL, a planarization layer 220, a pixel electrode PE, a pixel defining layer 240, a light emitting layer 250, a common electrode 260, and a thin film encapsulation layer 270.

The first substrate 111 may be a transparent insulating substrate including glass or transparent plastic. For example, the first substrate 111 may include kapton, polyethersulphone (PES), polycarbonate (PC), polyimide (PI), polyethyleneterephthalate (PET), polyethylene naphthalate (PEN), polyacrylate (PAR), or fiber reinforced plastic (FRP).

According to an exemplary embodiment of the present invention, the barrier layer 310 may be disposed on the first substrate 111. The barrier layer 310 may cover substantially an entire surface of the first substrate 111. For example, the barrier layer 310 may cover substantially an entire upper surface of the substrate 111. The barrier layer 310 may include a metal and a metal oxide. For example, the metal oxide included in the barrier layer 310 may have an increasingly higher density in a direction toward the OLED. Thus, a portion of the barrier layer 310 relatively closer to the OLED may have a higher density of metal oxide than a portion of the barrier layer 310 relatively further away from the OLED. Accordingly, as a portion of the barrier layer 310 is closer to the OLED, the portion of the barrier layer 310 may have characteristics similar to those of an inorganic layer rather than that of metal. For example, as a portion of the barrier layer 310 is closer to the OLED, the portion of the barrier layer 310 may have relatively higher transparency and relatively lower electrical conductivity.

Thus, since an upper portion of the barrier layer 310 has characteristics similar to the inorganic layer, effects of electric charges existing in the first substrate 111 and static electricity introduced from the outside on the thin film transistors T1 to T7 connected to the OLED may be reduced. Thus, the reliability of the thin film transistor and the OLED may be increased, thus substantially preventing an occurrence of a defective display.

Since a lower portion of the barrier layer 310 has characteristics similar to that of metal, it has a relatively high thermal conductivity, such that a heat generated in the display device may be rapidly released to increase the heat dissipation effects of the display device. In addition, since the lower portion of the barrier layer 310 has a relatively high reflectivity to light, a light emitted from the OLED according to an exemplary embodiment of the present invention may be reflected to a front surface of the display device. Accordingly, the luminous efficiency of the display device according to an exemplary embodiment of the present invention may be increased. The barrier layer 310 may have a thickness of about 800 Å or more, and thus may function as a reflective layer.

The barrier layer 310 may be electrically connected to a wiring, to which a substantially constant voltage is applied (e.g., through a contact hole). For example, the barrier layer 310 may be connected to the high potential line VDL, the pixel electrode PE, and the initialization line IL to which a substantially constant voltage is applied, such as the high potential driving voltage ELVDD, the low potential driving voltage ELVSS, or the initialization voltage Vinit, is applied.

The barrier layer 310 may include a metal of: aluminum (Al) or alloys thereof, silver (Ag) or alloys thereof, copper (Cu) or alloys thereof, and/or molybdenum (Mo) or alloys thereof. In addition, the barrier layer 310 may include one of chromium (Cr) and/or tantalum (Ta). In an exemplary embodiment of the present invention, the barrier layer 310 may have a multilayer structure including at least two conductive layers that have different physical properties from each other. In addition, the barrier layer 310 may include a metal oxide of: aluminum (Al) or alloys thereof, silver (Ag) or alloys thereof, copper (Cu) or alloys thereof, and/or molybdenum (Mo) or alloys thereof. In addition, the barrier layer 310 may include one of oxides of: chromium (Cr) and/or tantalum (Ta).

The buffer layer 120 may be located on the first substrate 111. The buffer layer 120 may be disposed over substantially an entire surface of the first substrate 111. The buffer layer 120 may substantially prevent permeation of undesirable elements and may planarize a surface therebelow. For example, the buffer layer 120 may include one of the followings: a silicon nitride ($SiN_x$) layer, a silicon oxide ($SiO_2$) layer, or a silicon oxynitride ($SiO_xN_y$) layer. However, the buffer layer 120 may be omitted (e.g., based on the kinds of the first substrate 111 and process conditions thereof).

The semiconductor layer 130 may be disposed on the buffer layer 120.

The semiconductor layer 130 may include respective channel areas CH1 of the first, second, third, fourth, fifth, sixth and seventh thin film transistors T1, T2, T3, T4, T5, T6 and T7. The semiconductor layer 130 may include source electrodes SE1 and drain electrodes DE1 of respective ones of the first, second, third, fourth, fifth, sixth and seventh thin film transistors T1, T2, T3, T4, T5, T6 and T7.

The semiconductor layer 130 may include at least one of the followings: a polycrystalline silicon layer, an amorphous silicon layer, and an oxide semiconductor such as indium galuim zinc oxide (IGZO) or indium zinc tin oxide (IZTO). For example, when the semiconductor layer 130 includes a polycrystalline silicon layer, the semiconductor layer 130 may include a channel area which is not doped with impurities and source and drain electrodes which are formed on opposite sides of the channel area and doped with impurity ions.

The gate insulating layer 140 may be disposed on the semiconductor layer 130 and the buffer layer 120. The gate insulating layer 140 may include at least one of: tetraethylorthosilicate (TEOS), silicon nitride ($SiN_x$), or silicon oxide ($SiO_2$). For example, the gate insulating layer 140 may have a double-layer structure where a $SiN_x$ layer having a thickness of about 40 nm and a TEOS layer having a thickness of about 80 nm are sequentially stacked.

The first gate electrode GE1 may be located on the gate insulating layer 140. For example, the first gate electrode GE1 may be located between the gate insulating layer 140 and the first insulating interlayer 160.

The scan lines SLn−1, SLn, and SLn+1 and the emission control line EL may be located between the gate insulating layer 140 and the first insulating interlayer 160.

The scan lines SLn−1, SLn and SLn+1 may include a metal of: aluminum (Al) or alloys thereof, silver (Ag) or alloys thereof, copper (Cu) or alloys thereof, and/or molybdenum (Mo) or alloys thereof. In addition, the scan lines SLn−1, SLn and SLn+1 may include one of chromium (Cr) and/or tantalum (Ta). In an exemplary embodiment of the present invention, the scan lines SLn−1, SLn and SLn+1 may have a multilayer structure including at least two conductive layers that have different physical properties from each other.

The emission control line EL may include a same material and have substantially a same structure (e.g., a multilayer structure) as those of the scan lines SLn−1, SLn and SLn+1. The emission control line EL and the scan lines SLn−1, SLn and SLn+1 may be substantially simultaneously formed in substantially a same process as each other.

The first insulating interlayer 160 may be located on the first gate electrode GE1 and the gate insulating layer 140. The first insulating interlayer 160 may have a thickness larger than a thickness of the gate insulating layer 140. The first insulating interlayer 160 may include a same material as a material included in the gate insulating layer 140.

The capacitor electrode 171 may be located on the first insulating interlayer 160. The capacitor electrode 171 may form a storage capacitor Cst together with the first gate electrode GE1. For example, at least two storage capacitors Cst may be formed (see, e.g., FIG. 3 and FIG. 4).

The initialization line IL may be located on the first insulating interlayer 160. For example, the initialization line IL may be located between the first insulating interlayer 160 and the second insulating interlayer 180.

The initialization line IL may receive the initialization voltage Vinit, having a substantially constant voltage, from the power supply portion 105. According to an exemplary embodiment of the present invention, the initialization line IL may be electrically connected to the barrier layer 310 (e.g., through a contact hole).

The second insulating interlayer 180 may be located on the capacitor electrode 171, the initialization line IL, and the first insulating interlayer 160. The second insulating interlayer 180 may have a thickness larger than a thickness of the gate insulating layer 140. The second insulating interlayer 180 may include a same material as a material included in the gate insulating layer 140.

The first connection electrode 191, the second connection electrode 192, the third connection electrode 192, the high potential line VDL, and the data line DL may be located on the second insulating interlayer 180.

The first connection electrode 191, the second connection electrode 192, the third connection electrode 192, the high potential line VDL, and the data line DL may include a refractory metal, e.g., molybdenum, chromium, tantalum or titanium, and/or an alloy thereof. The first connection electrode 191, the second connection electrode 192, the third connection electrode 192, the high potential line VDL, and the data line DL may have a multilayer structure including a refractory metal layer and a low-resistance conductive layer. Examples of the multilayer structure may include: a double-layer structure including a chromium or molybdenum (alloy) lower layer and an aluminum (alloy) upper layer; and a triple-layer structure including a molybdenum (alloy) lower layer, an aluminum (alloy) intermediate layer and a molybdenum (alloy) upper layer. In an exemplary embodiment of the present invention, the first source electrode SE1 may include or be formed of any suitable metals and/or conductors rather than the aforementioned materials.

The high potential line VDL may receive the high potential driving voltage ELVDD which may be a constant voltage from the power supply portion 105. According to an exemplary embodiment of the present invention, the high potential line VDL may be electrically connected to the barrier layer 310 (e.g., through a contact hole).

The planarization layer 220 may be located on the first connection electrode 191, the second connection electrode 192, the third connection electrode 193, the high potential line VDL and the data line DL.

The planarization layer 220 may planarize the first substrate 111 by eliminating a height difference of the first substrate 111 to increase luminous efficiency of the OLED to be formed thereon. The planarization layer 220 may include one or more materials of the followings: a polyacrylate resin, an epoxy resin, a phenolic resin, a polyamide resin, a polyimide resin, an unsaturated polyester resin, a polyphenylen ether resin, a polyphenylene sulfide resin, or benzocyclobutene (BCB).

The pixel electrode PE may be located on the planarization layer 220. A portion of or the entirety of the pixel electrode PE may be disposed in a light emitting area 280. As an example, the pixel electrode PE may be disposed in a position corresponding to the light emitting area 280 which is defined by the pixel defining layer 240. The pixel defining layer 240 is described in more detail below. The pixel electrode PE may be connected to the first connection electrode 191 through a contact hole passing through the planarization layer 220.

The pixel defining layer 240 may be located on the pixel electrode PE and the planarization layer 220. The pixel defining layer 240 may include an opening passing through the pixel defining layer 240. The opening may be in a position corresponding to the light emitting area 280.

The pixel defining layer 240 may include a resin such as a polyacrylate resin or a polyimide resin.

The light emitting layer 250 may be located on the pixel electrode PE in the light emitting area 280. The common electrode 260 may be located on the pixel defining layer 240 and the light emitting layer 250. The pixel electrode PE, the light emitting layer 250, and the common electrode 260 may be included in the OLED. In an exemplary embodiment of the present invention, the pixel electrode PE may be an anode electrode of the OLED, and the common electrode 260 may be a cathode electrode of the OLED.

The light emitting layer 250 may include a relatively low molecular weight organic material or a relatively high molecular weight organic material. At least one of a hole injection layer HIL and a hole transport layer HTL may be provided between the pixel electrode PE and the light emitting layer 250, and at least one of an electron transport layer ETL and an electron injection layer EIL may be provided between the light emitting layer 250 and the common electrode 260.

The common electrode 260 may receive the low potential driving voltage ELVSS, which may be a substantially constant voltage, from the power supply portion 105. According to an exemplary embodiment of the present invention, the common electrode 260 may be electrically connected to the barrier layer 310 (e.g., through a contact hole).

The pixel electrode PE and the common electrode 260 may each be a transmissive electrode, a transflective electrode or a reflective electrode.

A transparent conductive oxide ("TCO") may be used to form a transmissive electrode. The TCO may include at least one of indium tin oxide (ITO), indium zinc oxide (IZO), antimony tin oxide (ATO), aluminum zinc oxide (AZO), zinc oxide (ZnO), or mixtures thereof.

A metal, e.g., magnesium (Mg), silver (Ag), gold (Au), calcium (Ca), lithium (Li), chromium (Cr), aluminum (Al) and copper (Cu), or an alloy thereof may be included in a transflective electrode or a reflective electrode. In an exemplary embodiment of the present invention, whether an electrode is a transflective type or a reflective type may depend on the thickness of the electrode. Typically, the transflective electrode has a thickness of about 200 nm or less and the reflective electrode has a thickness of about 300 nm or more. As the thickness of the transflective electrode decreases, light transmittance and resistance increase. On the contrary, as the thickness of the transflective electrode increases, light transmittance decreases.

The transflective electrode and the reflective electrode may have a multilayer structure which includes a metal layer including a metal or a metal alloy and a TCO layer stacked on the metal layer.

The thin film encapsulation layer 270 may be located on the common electrode 260. The thin film encapsulation layer 270 may include a transparent insulating substrate including glass, or transparent plastic. The thin film encapsulation layer 270 may have a thin film encapsulation structure in which one or more inorganic layers and one or more organic layers are alternately stacked.

Figure 4:
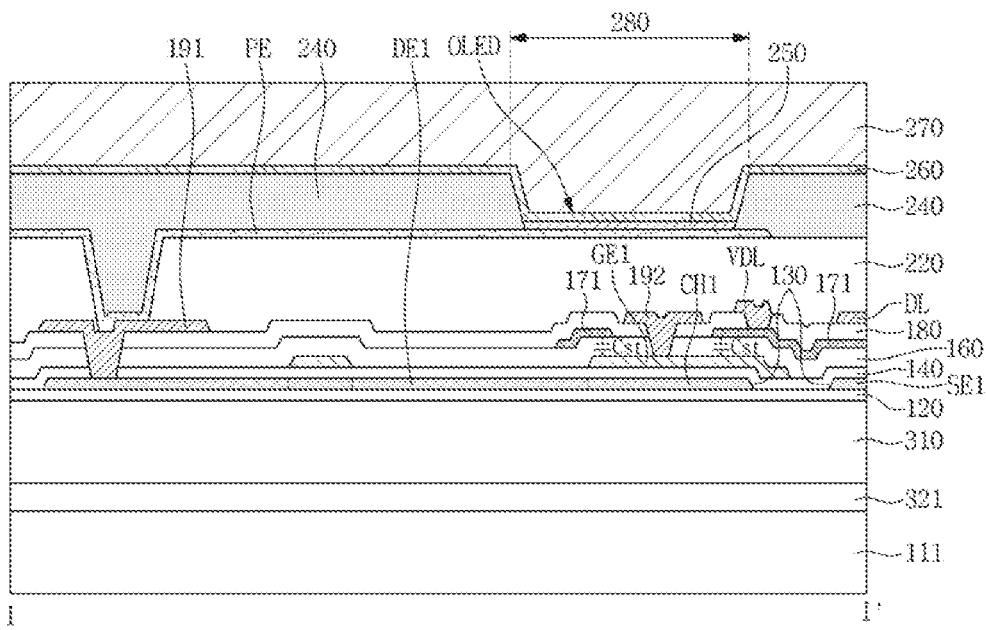
FIG. 4 is a cross-sectional view according to an exemplary embodiment of the present invention.

A display device according to an exemplary embodiment of the present invention will be described in more detail below with reference to FIG. 4. FIG. 4 is a cross-sectional view according to an exemplary embodiment of the present invention.

Referring to FIG. 4, according to an exemplary embodiment of the present invention, a first auxiliary buffer layer 321 may be included in the display device.

The first auxiliary buffer layer 321 may be located between the first substrate 111 and the barrier layer 310. The first auxiliary buffer layer 321 may cover substantially an entire surface of the first substrate 111. For example, the first auxiliary buffer layer 321 may cover substantially an entire upper surface of the first substrate 111. The first auxiliary buffer layer 321 may substantially prevent permeation of undesirable elements and may planarize a surface therebelow. As an example, the first auxiliary buffer layer 321 may include one of the followings: a silicon nitride ($SiN_x$) layer, a silicon oxide ($SiO_2$) layer, or a silicon oxynitride ($SiO_xN_y$) layer.

According to an exemplary embodiment of the present invention, a display device may include the substrate 111 and the auxiliary buffer layer 321 disposed on the substrate 111. The barrier layer 310 may be disposed on the auxiliary buffer layer 321. The buffer layer 120 may be disposed on the barrier layer 310. The thin film transistor may be disposed on the barrier layer 310. The light emitting element (e.g., the OLED) may be positioned above the thin film transistor. The light emitting element may overlap the thin film transistor along a direction orthogonal to an upper surface of the substrate 111. The barrier layer 310 may include an oxide of Al, Ag, Cu, Mo, Cr, or Ta. A density of the oxide may increase in a direction toward the light emitting element.

Figure 5:
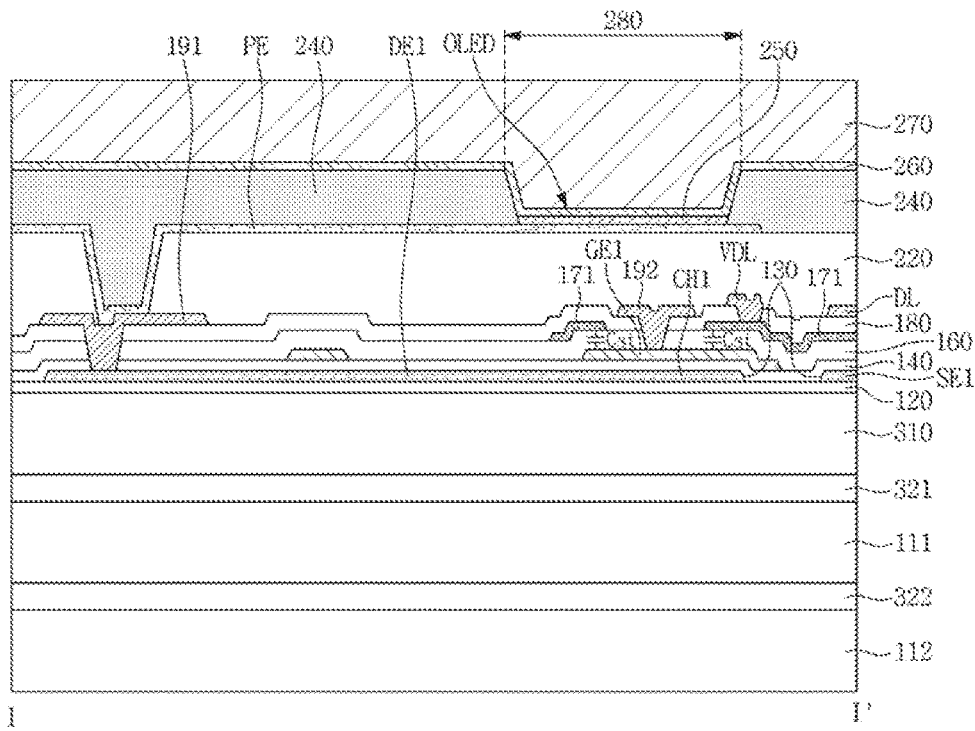
FIG. 5 is a cross-sectional view according to an exemplary embodiment of the present invention.

A display device according to an exemplary embodiment of the present invention will be described in more detail below with reference to FIG. 5. FIG. 5 is a cross-sectional view according to an exemplary embodiment of the present invention.

According to an exemplary embodiment of the present invention, a second substrate 112 and a second auxiliary buffer layer 322 may be further provided below the first substrate 111.

For example, the second substrate 112, the second auxiliary buffer layer 322, the first substrate 111, a first auxiliary buffer layer 321, and a barrier layer 310 may be sequentially stacked. As an example, the first and second substrates 111 and 112 and the first and second auxiliary buffer layers 321 and 322 may be alternately stacked.

The second substrate 112 may be a transparent insulating substrate including glass or plastic of a transparent material. For example, the second substrate 112 may include kapton, polyethersulphone (PES), polycarbonate (PC), polyimide (PI), polyethyleneterephthalate (PET), polyethylene naphthalate (PEN), polyacrylate (PAR), or fiber reinforced plastic (FRP).

The second auxiliary buffer layer 322 may substantially prevent permeation of undesirable elements and may planarize a surface therebelow. For example, the second auxiliary buffer layer 322 may include one of the following: a silicon nitride ($SiN_x$) layer, a silicon oxide ($SiO_2$) layer, or a silicon oxynitride ($SiO_xN_y$) layer.

A method of manufacturing a display device according to an exemplary embodiment of the present invention will be described in more detail below with reference to FIGS. 6A, 6B, 6C, and 6D.

FIGS. 6A, 6B, 6C, and 6D are views illustrating a process of manufacturing a display device according to an exemplary embodiment of the present invention.

Figure 6A:
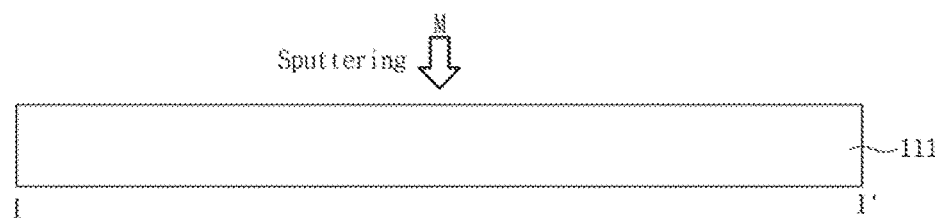
FIGS. 6A, 6B, 6C, and 6D are views illustrating a process of manufacturing a display device according to an exemplary embodiment of the present invention.

FIG. 6A is a view illustrating depositing of a metal M on the first substrate 111. For example, referring to FIG. 6A, the metal M may be deposited on the first substrate 111 by sputtering. In an exemplary embodiment of the present invention, the metal M may be aluminum (Al) or alloys thereof, silver (Ag) or alloys thereof, copper (Cu) or alloys thereof, and/or molybdenum (Mo) or alloys thereof. In addition, the barrier layer 310 may include one of chromium (Cr) and/or tantalum (Ta). In an exemplary embodiment of the present invention, the barrier layer 310 may have a multilayer structure including at least two conductive layers that have different physical properties from each other.

Figure 6B:
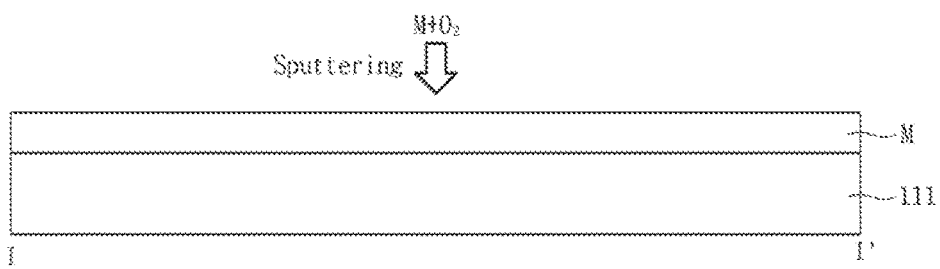

FIG. 6B is a view illustrating depositing of a metal M and an oxygen gas ($O_2$) substantially simultaneously on the metal M deposited on the first substrate 111. For example, referring to FIG. 6B, the metal M and the oxygen gas ($O_2$) may be substantially simultaneously deposited by sputtering.

Figure 6C:
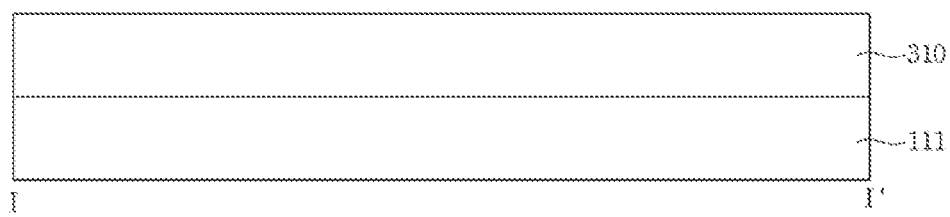

Accordingly, referring to FIG. 6C, the metal M and a metal oxide may be deposited on the metal M deposited on the first substrate 111 to form the barrier layer 310. The barrier layer 310 may have an increasingly higher density of the metal oxide along a direction away from the first substrate 111. As an example, the metal oxide included in the barrier layer 310 may have an increasingly higher density in a direction toward the OLED. Accordingly, a portion of the barrier layer 310 relatively closer to the OLED may have characteristics similar to an inorganic layer rather than that of metal. For example, a portion of the barrier layer 310 relatively closer to the OLED may have relatively higher transparency and relatively lower electrical conductivity than a portion of the battier layer 310 relatively further from the OLED.

Thus, since an upper portion of the barrier layer 310 may have characteristics similar to the inorganic layer, effects of electric charges existing in the first substrate 111 and static electricity introduced from the outside on the thin film transistors T1 to T7 connected to the OLED may be reduced. Thus, the reliability of the thin film transistor and the OLED may be increased, thus substantially preventing an occurrence of a defective display.

Since a lower portion of the barrier layer 310 may have characteristics similar to that of metal, the barrier layer 310 may have relatively high thermal conductivity, such that a heat generated in the display device may be rapidly released to increase the heat dissipation effects of the display device. In addition, since the lower portion of the barrier layer 310 may have a relatively high reflectivity to light, a light emitted from the OLED according to an exemplary embodiment of the present invention may be reflected to a front surface of the display device. Accordingly, the luminous efficiency of the display device according to an exemplary embodiment of the present invention may be increased. The barrier layer 310 may have a thickness of about 800 Å or more and thus the barrier layer 310 may function as a reflective layer in the above-described manner.

The barrier layer 310 may include a metal of: aluminum (Al) or alloys thereof, silver (Ag) or alloys thereof, copper (Cu) or alloys thereof, and/or molybdenum (Mo) or alloys thereof. In addition, the barrier layer 310 may include one of chromium (Cr) and/or tantalum (Ta). In an exemplary embodiment of the present invention, the barrier layer 310 may have a multilayer structure including at least two conductive layers that have different physical properties from each other. In addition, the barrier layer 310 may include a metal oxide of: aluminum (Al) or alloys thereof, silver (Ag) or alloys thereof, copper (Cu) or alloys thereof, and/or molybdenum (Mo) or alloys thereof. In addition, the barrier layer 310 may include one of oxides of chromium (Cr) and/or tantalum (Ta).

Figure 6D:
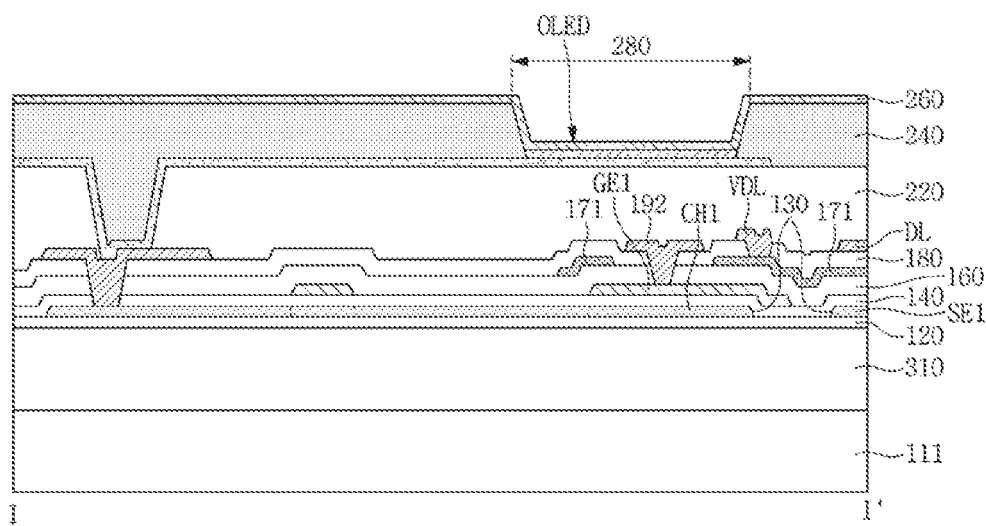

FIG. 6D is a view illustrating forming of the plurality of thin film transistors T1 to T7 and the OLED on the barrier layer 310.

For example, the plurality of thin film transistors T1 to T7, the plurality of wirings SLn−1, SLn, SLn+1, EL, IL, DL, VDL, 191, 192, and 193 selectively connected to the plurality of thin film transistors T1, T2, T3, T4, T5, T6, and T7, and the OLED including the capacitor electrode 171, the pixel electrode PE, the light emitting layer 250, and the common electrode 260 are formed on the barrier layer 310.

Subsequently, the thin film encapsulation layer 270 is formed on the OLED (see, e.g., FIG. 3).

As described herein, the display device and the method of manufacturing the display device according to an exemplary embodiment of the present invention may substantially prevent display failure due to electric charges and static electricity in a substrate by including a substrate including a metal and a metal oxide. In addition, according to an exemplary embodiment of the present invention, heat dissipation effects of the display device may be increased.

While the present invention has been illustrated and described with reference to the exemplary embodiments thereof, it will be apparent to those of ordinary skill in the art that various changes in form and detail may be made thereto without departing from the spirit and scope of the present invention.

What is claimed is:
1. A display device comprising:
    a first substrate;
    a barrier layer disposed on the first substrate;
    a thin film transistor on the barrier layer; and
    an organic light emitting element connected to the thin film transistor,
    wherein the barrier layer comprises a metal including at least one of Al, Ag, Cu, Mo, Cr, or Ta;
    wherein the barrier layer further includes an oxide the metal; and
    wherein the oxide of the metal has an increasingly higher density along a direction away from the first substrate.

2. The display device of claim 1, wherein the oxide of the metal has the increasingly higher density in a direction toward the organic light emitting element.

3. The display device of claim 1, further comprising a second substrate on a lower surface of the first substrate.

4. The display device of claim 1, further comprising an auxiliary buffer layer between the barrier layer and the first substrate.

5. The display device of claim 1, further comprising a wiring electrically connected to a power supply portion and electrically connected to the thin film transistor and the organic light emitting element, wherein the power supply portion is configured to provide a substantially constant voltage to the thin film transistor and the organic light emitting element, and
    wherein the wiring is electrically connected to the barrier layer.

6. The display device of claim 5, wherein the wiring comprises at least one of a common power line, a high potential line, or an initialization line.

7. The display device of claim 1, wherein the barrier layer has a thickness of about 800 Å or more.

8. The display device of claim 1, wherein the organic light emitting element comprises:
    a first electrode on the barrier layer,
    a light emitting layer on the first electrode; and
    a second electrode on the light emitting layer.

9. The display device of claim 1, further comprising a thin film encapsulation layer on the organic light emitting element.

10. The display device of claim 9, wherein the thin film encapsulation layer comprises:
    at least one inorganic layer on the organic light emitting element; and
    at least one organic layer on the inorganic layer.

11. A method of manufacturing a display device, the method comprising:
    forming a barrier layer on a first substrate;
    forming a thin film transistor on the barrier layer;
    forming an organic light emitting element on the thin film transistor; and
    forming a thin film encapsulation layer on the organic light emitting element,
    wherein forming of the barrier layer on the first substrate comprises:
        depositing a metal; and
        substantially simultaneously depositing the metal and an oxygen gas.

12. The method of claim 11, wherein a metal oxide included in the barrier layer has an increasingly higher density in a direction toward the organic light emitting element.

13. The method of claim 11, further comprising, before forming the barrier layer on the first substrate:
    disposing the first substrate on a second substrate.

14. The method of claim 13, further comprising, before forming the barrier layer on the first substrate:
    forming a first auxiliary buffer layer on the second substrate; and
    disposing the first substrate on the first auxiliary buffer layer.

15. The method of claim 11, wherein depositing the metal comprises depositing the metal through sputtering.

16. The method of claim 11, wherein the metal comprises at least one of Al, Ag, Cu, Mo, Cr, or Ta.

17. A display device comprising:
- a substrate;
- an auxiliary buffer layer disposed on the substrate;
- a barrier layer disposed on the auxiliary buffer layer;
- a buffer layer disposed on the barrier layer;
- a thin film transistor disposed on the barrier layer; and
- a light emitting element positioned above the thin film transistor, wherein the light emitting element overlaps the thin film transistor along a direction orthogonal to an upper surface of the substrate,
- wherein the barrier layer comprises an oxide of Al, Ag, Cu, Mo, Cr, or Ta, and wherein a density of the oxide increases in a direction toward the light emitting element.

18. The display device of claim 17, wherein the light emitting element is an organic light emitting element.

19. The display device of claim 18, further comprising a wiring electrically connected to a power supply portion and electrically connected to the thin film transistor and the light emitting element,
- wherein the power supply portion is configured to provide a substantially constant voltage to the thin film transistor and the light emitting element, and
- wherein the wiring is electrically connected to the barrier layer.

20. The display device of claim 19, the wiring comprises at least one of a common power line, a high potential line, or an initialization line.

* * * * *